United States Patent [19]

Kamimaru et al.

[11] Patent Number: 4,473,885

[45] Date of Patent: Sep. 25, 1984

[54] FREQUENCY DIVIDING RATIO SETTING DEVICE FOR PROGRAMMABLE COUNTERS

[75] Inventors: Nobuyuki Kamimaru; Hiroaki Suzuki, both of Yokohama, Japan

[73] Assignee: Tokyo Shibaura Denki Kabushiki Kaisha, Japan

[21] Appl. No.: 267,925

[22] Filed: May 28, 1981

[30] Foreign Application Priority Data

May 31, 1980 [JP] Japan ................................. 55-73143

[51] Int. Cl.³ ........................................... H03K 21/36
[52] U.S. Cl. ................................. 364/703; 377/111; 377/110; 364/701
[58] Field of Search .................. 377/47, 52, 110, 111, 377/130, 129; 364/703, 701

[56] References Cited

U.S. PATENT DOCUMENTS

| | | | |
|---|---|---|---|
| 3,651,414 | 3/1972 | Jamieson | 377/44 |
| 4,223,268 | 9/1980 | Shimizu | 377/110 |
| 4,234,849 | 11/1980 | Crilly, Jr. | 377/110 |
| 4,296,380 | 10/1981 | Minakuchi | 377/110 |
| 4,349,887 | 9/1982 | Crowley | 364/721 X |

FOREIGN PATENT DOCUMENTS

45-26443 9/1970 Japan.
50-4286 2/1975 Japan.

Primary Examiner—Gareth D. Shaw
Assistant Examiner—Ronni S. Malamud
Attorney, Agent, or Firm—Finnegan, Henderson, Farabow, Garrett & Dunner

[57] ABSTRACT

A frequency dividing ratio setting device capable of successively changing the frequency dividing ratio of a programmable counter and further changing the changed portion of the frequency dividing ratio is provided. The device comprises a circuit for generating a pulse signal corresponding to predetermined data, an adder-subtracter having first and second input terminals and adding or subtracting data supplied to first and second input terminals thereof, said first input terminal being connected to the output terminal of the pulse signal generating circuit, and a shift register to which an output signal is supplied from the adder-subtracter and supplying an input signal to a program terminal of the programmable counter and to the second input terminal of the adder-subtracter.

9 Claims, 56 Drawing Figures

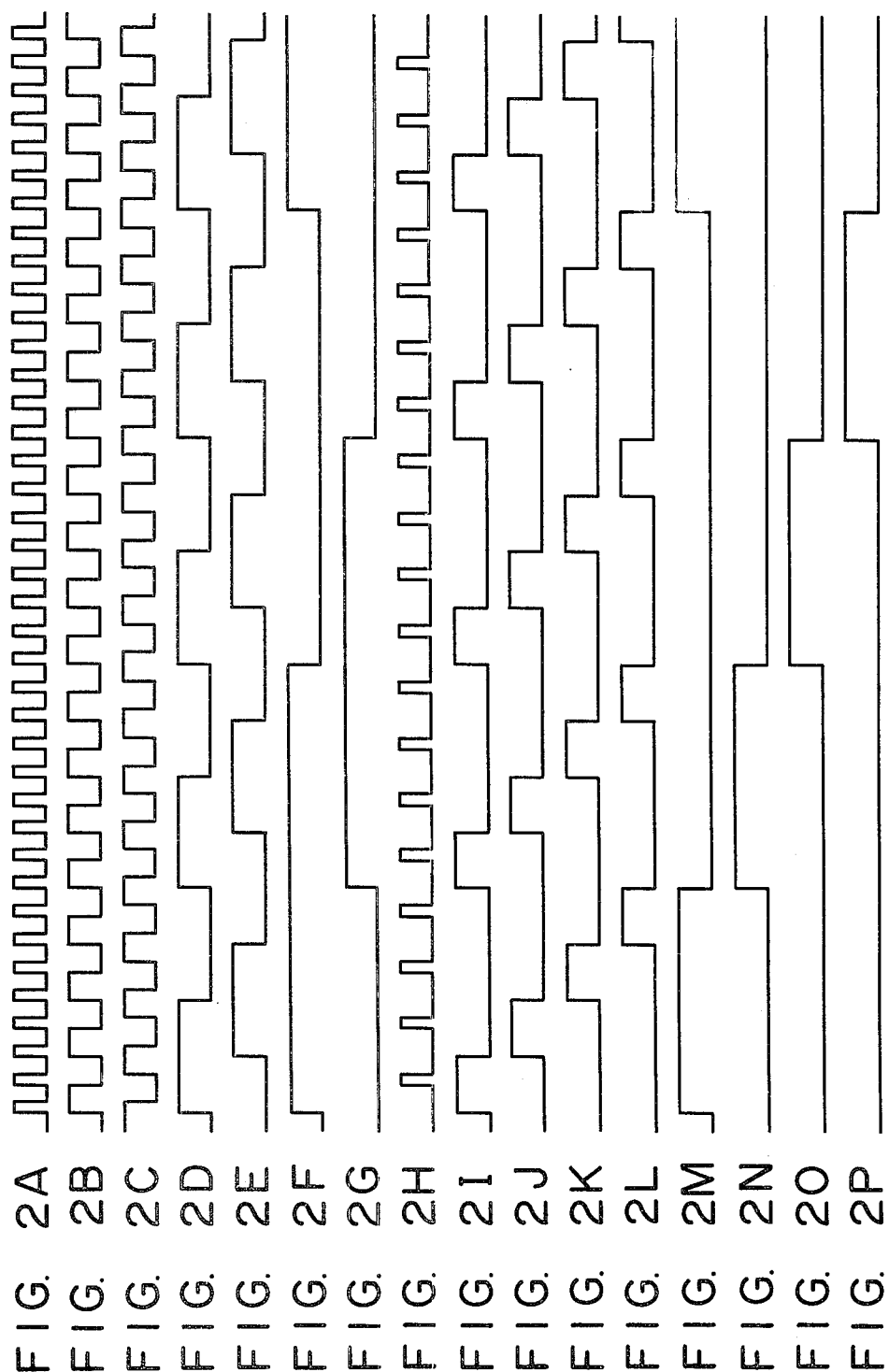

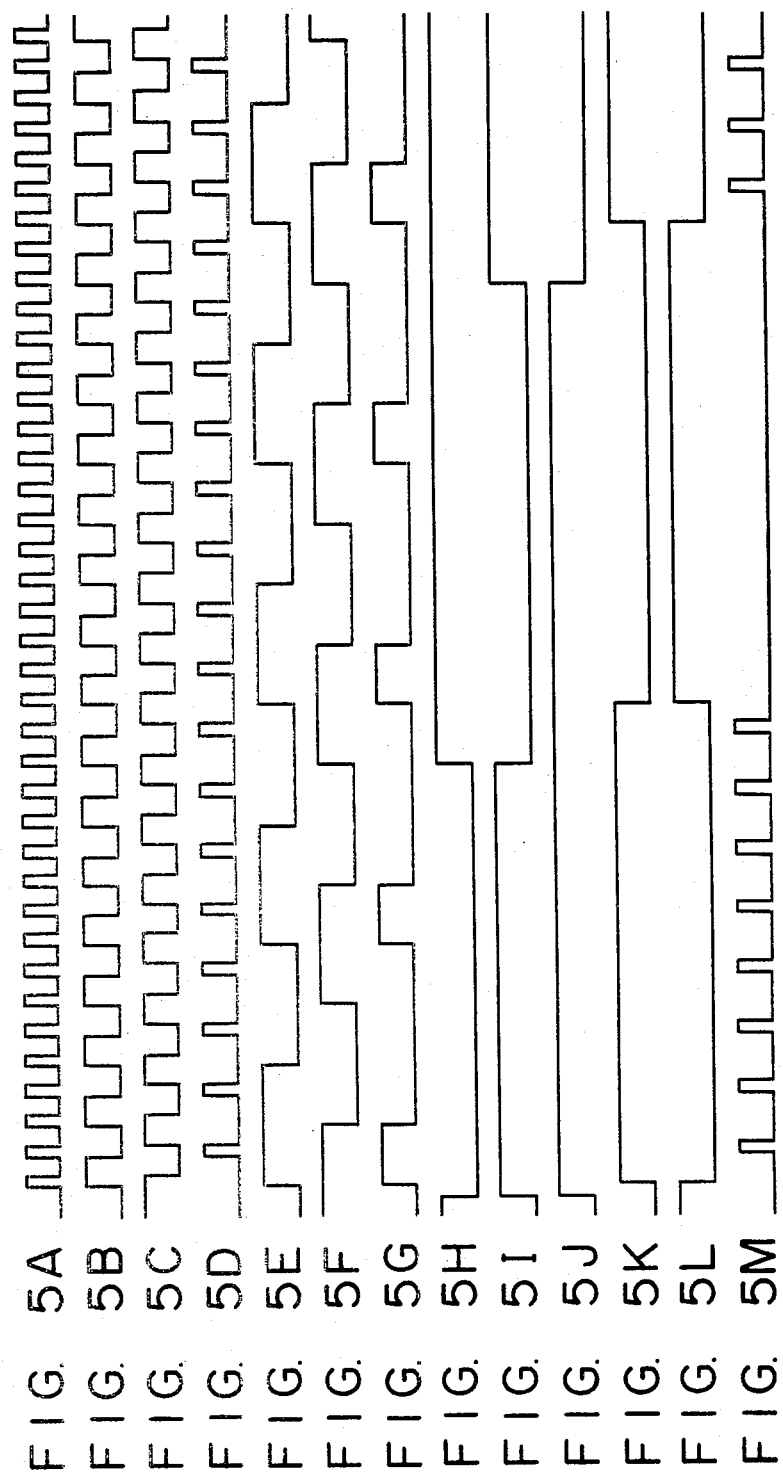

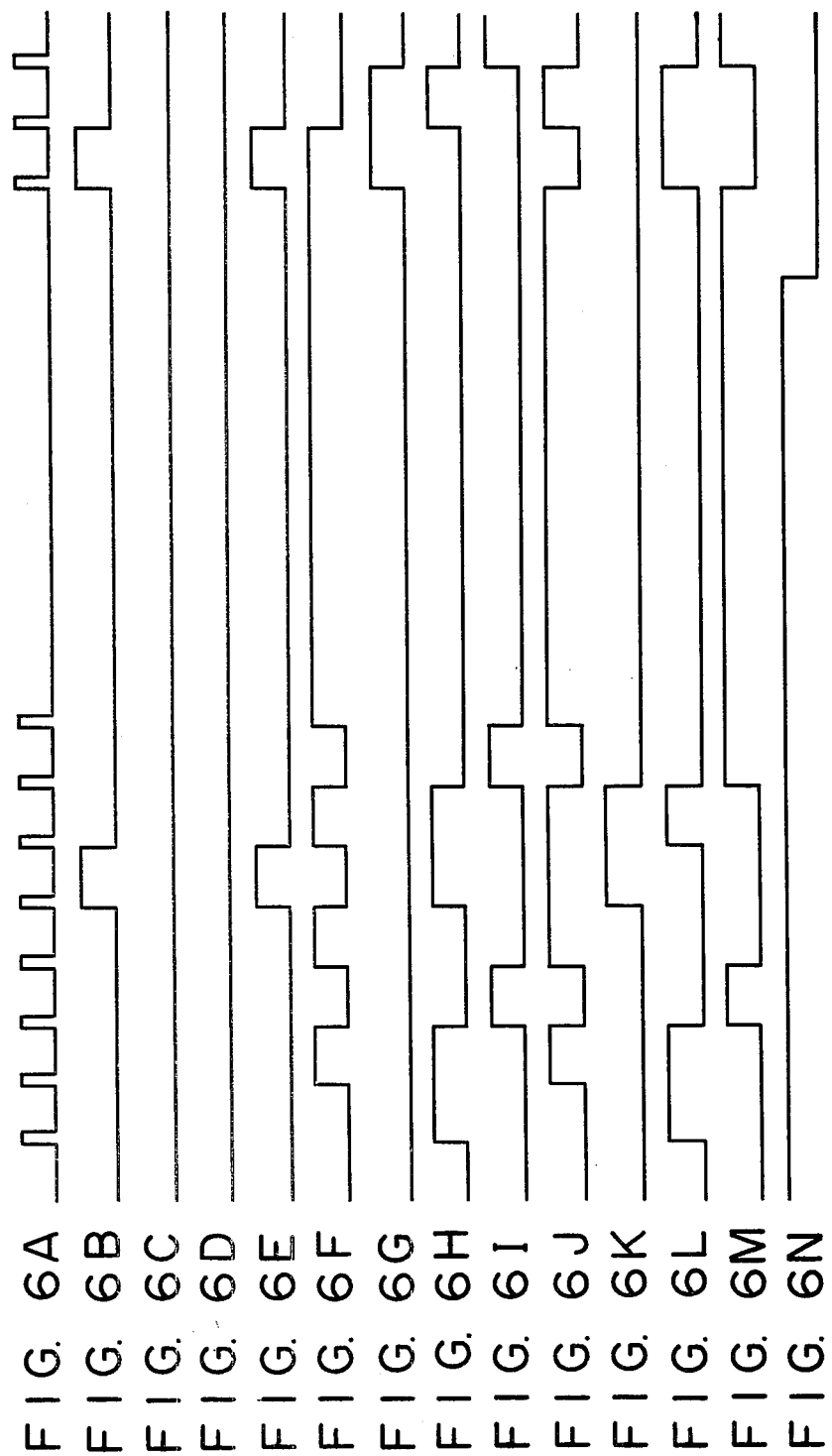

FREQUENCY DIVIDING RATIO SETTING DEVICE FOR PROGRAMMABLE COUNTERS

BACKGROUND OF THE INVENTION

The present invention relates to a frequency dividing ratio setting device for programmable counters.

There has been widely used the programmable counter to frequency-divide clock pulses supplied corresponding to a value of program terminals. For the purpose of changing the frequency dividing ratio, changeover switches are arranged connected to the program terminals and the program terminal is set to the H or L level by the switching operation of the changeover switch. Or an up/down-counter is arranged to supply output signals to the program terminals.

However, it is troublesome to change the frequency dividing ratio in the case of changeover switches employed, and it is also unpractical to use changeover switches because the number of changeover switches increases as the frequency dividing ratio becomes larger. Further, in the case where a local frequency is provided in the synthesizer-receiver of PLL type, for example, to set the frequency dividing ratio using the output signal of the up/down-counter, the following disadvantage occurs. Namely, a channel band for AM band is 9 KHz in Japan and the frequency dividing ratio of programmable counter must be a multiple of 9. Therefore, it must always be checked whether or not the content of the counter has reached a multiple of 9, thus making it necessary to add a circuit. In addition, the additional circuit will be very complicated.

SUMMARY OF THE INVENTION

The object of the present invention is to provide a frequency dividing ratio setting device simple in construction and capable of changing the frequency dividing ratio of programmable counters optionally.

This object can be attained by a frequency dividing ratio setting device for programmable counters comprising a circuit for generating a signal to indicate add-subtract operation, a circuit connected to the operation indicating signal generating circuit and for generating pulse signals corresponding to the operation indicating signal, an adder-subtracter having first and second input terminals and a control terminal, the first input terminal being connected to the pulse signal generating circuit and the control terminal being connected to the operation indicating signal generating circuit, and the adder-subtracter serving to add or subtract data supplied to the first and second input terminals responsive to the operation indicating signal, and a frequency dividing ratio setting circuit connected to the pulse signal generating circuit and adder-subtracter to supply the output signal of the adder-subtracter to the second terminal of the adder-subtracter and to a frequency dividing ratio setting terminal of a programmable counter responsive to the pulse signals.

BRIEF DESCRIPTION OF THE DRAWINGS

FIGS. 2A through 2P and 3A through 3I show a time chart to explain the operation of the first embodiment;

FIGS. 5A through 5M and 6A through 6N show a time chart to explain the operation of the second embodiment.

DETAILED DESCRIPTION OF THE PREFERRED EMBODIMENTS

Figure 1A:
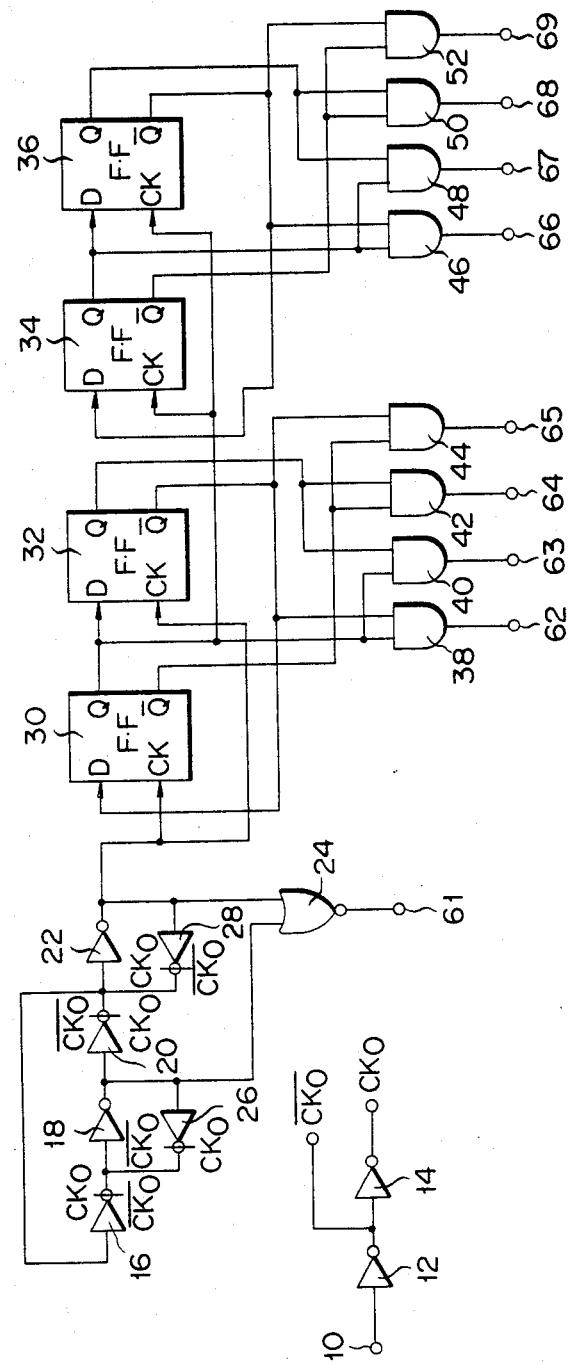
FIGS. 1A and 1B show a circuit diagram of a first embodiment of a frequency dividing ratio setting device according to the present invention.
Figure 1B:
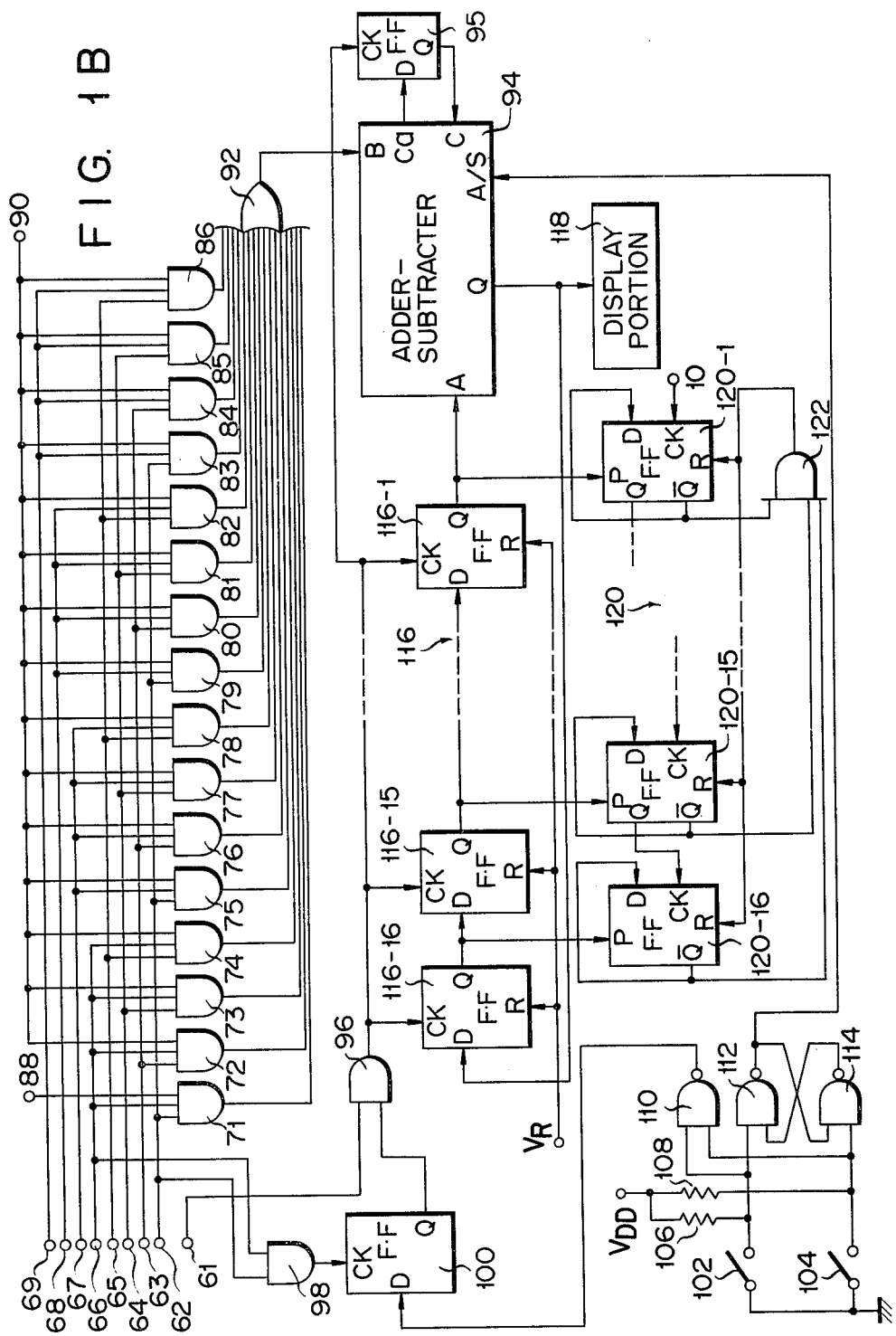

An embodiment of the programmable counter according to the present invention will be now described referring to the drawings. FIGS. 1A and 1B show the circuit of the embodiment. A clock terminal 10 to which clock pulse signals are supplied is connected via an inverter 12 to the input terminal of an inverter 14. The output terminal of the inverter 12 is connected to a terminal $\overline{CKo}$ and the output terminal of the inverter 14 to a terminal CKo. Clocked inverter 16, inverter 18, clocked inverter 20 and inverter 22 are connected in series with one another. The output terminal of the inverter 18 is connected to one input terminal of a NOR gate 24 and via a clocked inverter 26 to the input terminal of the inverter 18. The output terminal of the clocked inverter 20 is coupled to the input terminal of the inverter 16. The output terminal of the inverter 22 is connected to the other input terminal of the NOR gate 24 and via a clocked inverter 28 to the input terminal of the inverter 22.

The output terminal of the inverter 22 is connected to clock terminals CK of D flip-flops 30 and 32. The output terminal Q of the D flip-flop 30 is connected to the input terminal D of the D flip-flop 32, clock terminals CK of D flip-flops 34 and 36, and one input terminals of AND gates 38 and 40. The output terminal $\overline{Q}$ of the D flip-flop 30 is connected to one input terminals of AND gates 42 and 44. The output terminal Q of the D flip-flop 32 is connected to the other input terminals of the AND gates 40 and 42 and the output terminal $\overline{Q}$ thereof to the input terminal D of the D flip-flop 30 and to the other input terminals of the AND gates 38 and 44. The output terminal Q of the D flip-flop 34 is connected to the input terminal D of a D flip-flop 36 and to one input terminals of AND gates 46 and 48, while the output terminal $\overline{Q}$ thereof to one input terminals of AND gates 50 and 52. The output terminal Q of the D flip-flop 36 is connected to the other input terminals of AND gates 48 and 50, and the output terminal $\overline{Q}$ thereof to the input terminal D of the D flip-flop 34 and to the other input terminals of the AND gates 46 and 52.

An output terminal 62 of the AND gate 38 is connected to first input terminals of AND gates 71, 75, 79 and 83. An output terminal 63 of the AND gate 40 is connected to first input terminals of AND gates 72, 76, 80 and 84. An output terminal 64 of the AND gate 42 is connected to first input terminals of AND gates 73, 77, 81 and 85. An output terminal 65 of the AND gate 44 is connected to first input terminals of AND gates 74, 78, 82 and 86. An output terminal 66 of the AND gate 46 is connected to second input terminals of the AND gates 71 through 74. An output terminal 67 of the AND gate 48 is connected to second input terminals of the AND gates 75 through 78. An output terminal 68 of the AND gate 50 is connected to second input terminals of the AND gates 79 through 82. An output terminal 69 of the AND gate 52 is connected to second input terminals of the AND gates 83 through 86. A terminal 88 to which a signal of logical level 1 (which will be hereinafter referred to as H level) is supplied is connected to a third input terminal of the AND gate 71, and a terminal 90 to which a signal of logical level 0 (which will be hereinafter referred to as L level) is supplied is connected to third input terminals of the AND gates 72 through 86. Output terminals of the AND gates 71 through 86 are connected to input terminals of an OR gate 92, whose output terminal is connected to an input terminal B of an adder-subtracter 94.

An output terminal 61 of the OR gate 24 is connected to one input terminal of an AND gate 96. The output terminal 62 of the AND gate 38 is connected to one input terminal of an AND gate 98, and the output terminal 66 of the AND gate 46 to the other input terminal of the AND gate 98, whose output terminal is connected to a clock terminal CK of a D flip-flop 100.

One terminal of up-counting switch 102 and down-counting switch 104 are grounded and the other terminals thereof are connected via respective resistors 106 and 108 to a power source terminal $V_{DD}$. A connection point between the switch 102 and resistor 106 is connected to one input terminals of NAND gates 110 and 112. A connection point between the switch 104 and resistor 108 is connected to the other input terminal of the NAND gate 110 and to one input terminal of a NAND gate 114. An output terminal of the NAND gate 110 is connected to an input terminal D of the D flip-flop 100. Output terminals of the NAND gates 112 and 114 are connected to the other input terminals of the other NAND gates, respectively, to form a flip-flop. The output terminal of the NAND gate 112 is connected to a control terminal A/S of the adder-subtracter 94.

An output terminal Q of the D flip-flop 100 is connected to the other input terminal of the AND gate 96, whose output terminal is connected to clock terminals CK of D flip-flops 116-1 through 116-16 which form a shift register 116. An output terminal Q of the D flip-flop in each stage of the shift register 116 is connected to an input terminal D of the D flip-flop in a next lower stage thereof, and an output terminal Q of the D flip-flop 116-1 in the lowermost stage thereof is connected to an input terminal A of the adder-subtracter 94, whose carry terminal Ca is connected to an input terminal D of a D flip-flop 95. The output terminal of the AND gate 96 is connected to a clock terminal CK of the D flip-flop 95, whose output terminal Q is connected to the terminal C of the adder-subtracter 94. An output terminal Q of the adder-subtracter 94 is connected to a display portion 118 and to an input terminal D of the D flip-flop 116-16 in the uppermost stage of the shift register 116. The reset power source terminal $V_R$ is connected to reset terminals R of the D flip-flops 116-1 through 116-16.

Output terminals Q of the D flip-flops 116-1 through 116-16 are connected to program terminals P of D flip-flops 120-1 through 120-16 of a binary programmable counter 120. The clock terminal 10 is connected to a clock terminal CK of the D flip-flop 120-1. An output terminal Q of the D flip-flop in each stage of the binary programmable counter 120 is connected to a clock terminal CK of the D flip-flop in a next upper stage thereof. Output terminals $\overline{Q}$ of the D flip-flops 120-1 through 120-16 are connected to input terminals D thereof and to input terminals of an AND gate 122, whose output terminal is connected to reset terminals R of the D flip-flops 120-1 through 120-16.

Figures 3A, 3B, 3C, 3D, 3E, 3F, 3G, 3H, 3I:
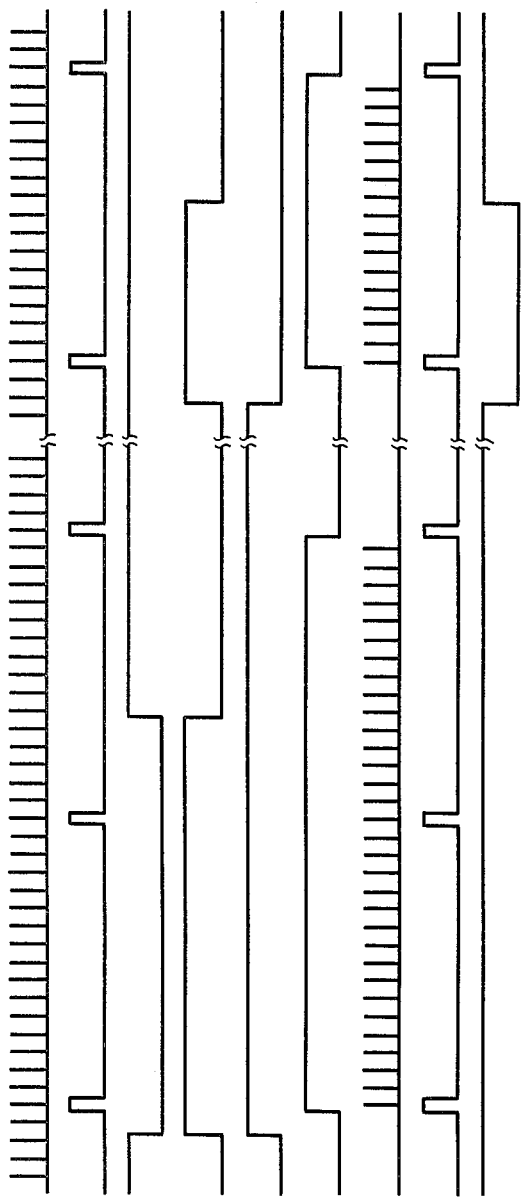

There will now be described the operation of this embodiment. When a clock pulse signal shown in FIG. 2A is supplied to the clock terminal 10 in FIG. 1A, pulse signals shown in FIGS. 2B and 2C are applied from the output terminals of the inverters 22 and 18. The output signal (FIG. 2B) of the inverter 22 is supplied to the clock terminals CK of the D flip-flops 30 and 32, and therefore the Q output signals of the D flip-flops 30 and 32 become as shown in FIGS. 2D and 2E. Since the Q output signal (FIG. 2D) of the D flip-flop 30 is supplied to the clock terminals CK of the D flip-flops 34 and 36, the Q output signals of the D flip-flops 34 and 36 become as shown in FIGS. 2F and 2G. As the result, pulse signals shown in FIGS. 2H through 2P are generated from the output terminals 61 through 69 of the NOR gate 24 and the AND gates 38, 40, 42, 44, 46, 48, 50 and 52. The output signal (FIG. 2H) of the NOR gate 24 is shown in FIG. 3A with the time axis abridged. Since the output signals of the AND gates 38 and 46 are supplied to the AND gate 98, the output signal of the AND gate 98 becomes such a pulse signal as shown in FIG. 3B.

It is assumed that the shift register 116 is reset by the reset power source terminal $V_R$ and data or a frequency dividing ratio supplied to the program terminals of the programmable counter 120 be zero at the time of power supply. Or, though not shown, a ROM may be arranged in the shift register 116 to supply initial data of the shift register 116, i.e., an initial value of the frequency dividing ratio of the programmable counter depending upon contents of this memory.

Switches 102 and 104 are normally open when the up-counting switch 102 is closed by an operator, the connection point between the switch 102 and resistor 106 becomes of L level as shown in FIG. 3C, thus causing the output terminals of the NAND gates 110 and 112 to become of H level as shown in FIGS. 3D and 3E. The adder-subtracter 94 adds data supplied to the input terminals A and B thereof when the control terminal A/S is of H level, while subtracts data applied to the input terminal B from data applied to the input terminal A when the control terminal A/S is of L level. Since the output terminal of the NAND gate 112 are now of H level, the adder-subtracter 94 is in an adding mode.

The D flip-flop 100 responses to the output pulse (FIG. 3B) of the AND gate 98 to cause the output terminal Q thereof to become of H level as shown in FIG. 3F. The AND gate 96 is thus rendered conductive and the output pulse signal (FIG. 2H) of the NOR gate 24 is supplied from the output terminal of the AND gate 96 as shown in FIG. 3G. One output pulse of the AND gate 98 is generated every time when sixteen output pulses (FIG. 2H) of the NOR gate 24 are supplied, as shown in FIG. 3B. Therefore, the switch 102 is opened just after it is closed, and the output terminal of the NAND gate 110 becomes of L level, the Q output signal of the D flip-flop 100 is held of H level and the AND gate 96 conductive during the time period when sixteen output pulses of the NOR gate 24 are being supplied. Accordingly, sixteen clock pulses are supplied to the shift register 116 and sixteen-bit data in the shift register 116 are applied to the input terminal A of the adder-subtracter 94.

Since the terminal 88 is of H level and the terminal 90 is of L level, the AND gates 72 through 86 are under non-conductive condition. The output signals of the AND gates 38 and 46 are respectively supplied to the first and second input terminals of the AND gate 71 and therefore, the output signal of the AND gate 71, i.e., the output signal of the OR gate 92 is same as the output signal (FIG. 3B) of the AND gate 98, as shown in FIG. 3H. Namely, the output signal of the OR gate 92 has a pulse at the timing when the first one of sixteen output pulses of the AND gate 96 is supplied, as shown in FIG. 3G. The output signal of the OR gate 92 is supplied to the input terminal B of the adder-subtracter 94 and therefore added with the lowermost-bit data of the shift register 116. Namely, the add-subtract value of this adder-subtracter 94 is set to 1.

Since the data of the shift register 116 represent zero, the data applied from the Q terminal of the adder-subtracter 94 represent 1 and the content of the shift register 116 or the frequency dividing ratio of the programmable counter 120 becomes 1 when sixteen pulses are supplied from the AND gate 96.

As described above, the frequency dividing ratio of the programmable counter 120 increases by 1 when the up-counting switch 102 is closed and the Q output terminal of the D flip-flop 100 becomes of H level. And as the switch 102 is held closed, the frequency dividing ratio continues increasing. An output signal of the adder-subtracter 94 which corresponds to the frequency dividing ratio is supplied to the display portion 118 and displayed there for recognition.

After the frequency dividing ratio becomes a predetermined one, in this case 13, the output terminal of the NAND gate 110 is of L level as shown in FIG. 3D if both of switches 102 and 104 are held opened. When the operator has verified that the displayed frequency ratio has reached the desired value (in this case 13), he opens switch 102. Because switch 104 is also opened, the output terminal of the NAND gate 110 is L level, as is shown in FIG. 3D. Therefore, the AND gate 96 is closed and the shift register 116 shifts no data, thus causing the frequency dividing ratio to be fixed.

When the down-counting switch 104 is closed thereafter, the connection point between the switch 104 and resistor 108 becomes of L level as shown in FIG. 3I, and the output terminals of the NAND gates 110 and 112 become of H and L levels, respectively. Therefore, the control terminal A/S of the adder-subtracter 94 becomes of L level and the adder-subtracter 94 is changed to a mode of subtracting the data applied to the input terminal B thereof from the data applied to the input terminal A thereof. Similarly in the adding mode as described above, the frequency dividing ratio of the programmable counter 120 decreases by 1 every time when sixteen output pulses of the AND gate 96 are supplied.

It has been described above that the output pulse of the OR gate 92 is produced at the timing when the first one of sixteen output pulses of the AND gate 96 is produced and that the add-subtract value of the adder-subtracter 94 is set to 1 because only the third input terminal of the AND gate 71 is connected to the terminal 88 of H level. However, the timing at which the output pulse of the NOR gate 92 is produced can be changed along with the add-subtract value by appropriately setting the level of the third input terminals of the AND gates 71 through 86.

As described above, the embodiment in which the operational result obtained by the adder-subtracter is employed as a signal for setting a frequency dividing ratio enables a frequency dividing ratio setting device to be provided for use to the programmable counter, allowing the frequency dividing ratio to be easily changed by varying the add-subtract value which is to be supplied to the adder-subtracter.

The following is a description of a second embodiment of the invention. In the first embodiment the frequency dividing ratio was set in a binary programmable counter. In the second embodiment the frequency dividing ratio (BCD number) of a BCD programmable counter is set. The frequency dividing ratio is calculated for each digit of the BCD by a circuit the same as that shown in FIG. 1B.

Figure 4A:
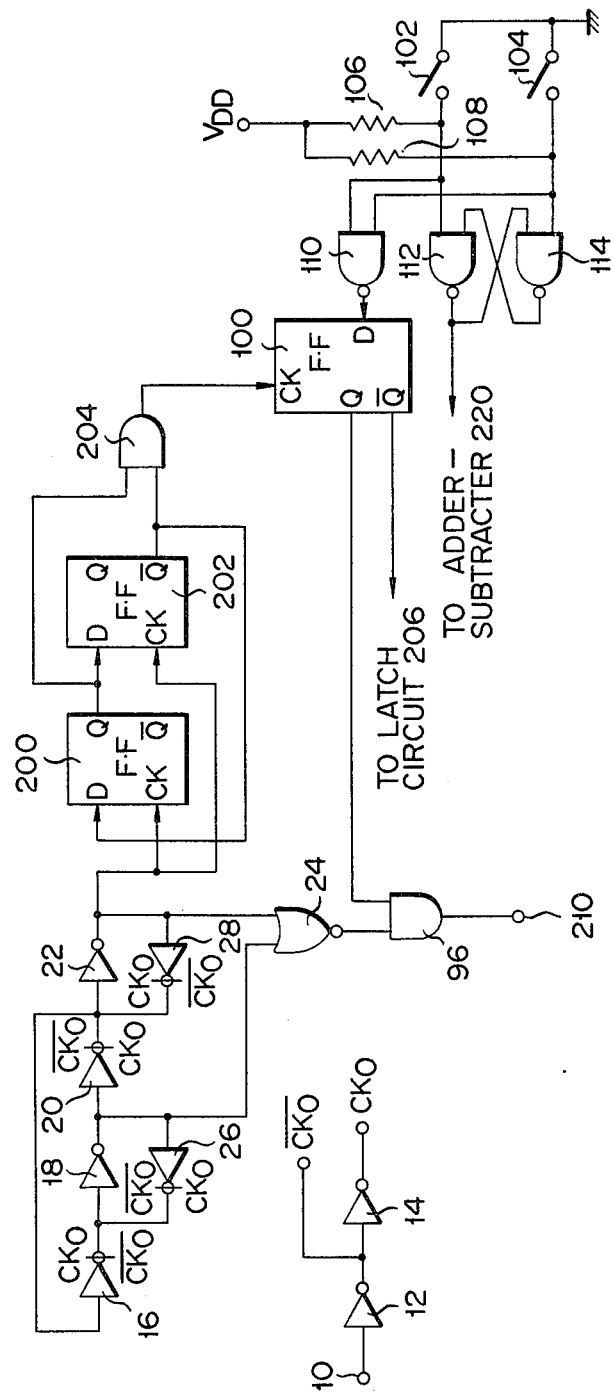
FIGS. 4A and 4B show a circuit diagram of a second embodiment of a frequency dividing ratio setting device according to the present invention.
Figure 4B:
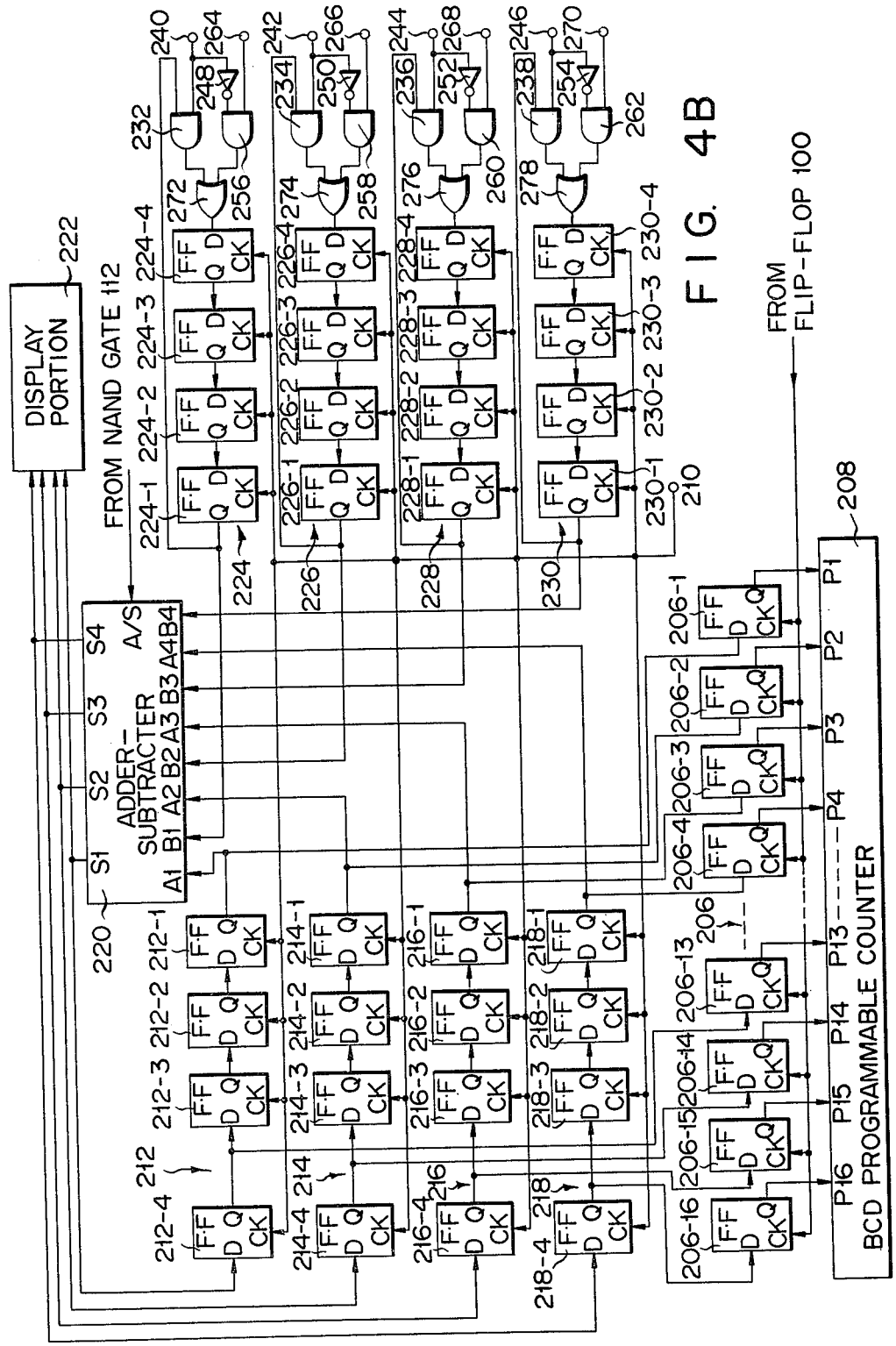

FIGS. 4A and 4B show the circuit of this second embodiment in which same parts as those of the first embodiment are represented by same reference numerals and the description of these parts will be omitted.

An output terminal of the inverter 22 is connected to clock terminals CK of D flip-flops 200 and 202. An output terminal Q of the D flip-flop 200 is connected to an input terminal D of the D flip-flop 202 and to one input terminal of an AND gate 204. An output terminal $\bar{Q}$ of the D flip-flop 202 is connected to the other input terminal of the AND gate 204 and to an input terminal D of the D flip-flop 200. An output terminal of the AND gate 204 is connected to a clock terminal CK of a D flip-flop 100 and an output terminal $\bar{Q}$ of the D flip-flop 100 is connected to clock terminals CK of D flip-flops 206-1 through 206-16 which form a latch circuit 206. Output terminals Q of the D flip-flops 206-1 through 206-16 are connected to program terminals P1 through P16 of a BCD programmable counter 208. The frequency dividing ratio of the programmable counter 208 is expressed in BCD notation in such a way that the program terminals P1 through P4 of a first through fourth digits represent the unit place of a BCD number, the program terminals P5 through P8 of a fifth through eighth digits the tenth place of a BCD number, the program terminals P9 through P12 of a ninth through twelfth digits the hundredth place of a BCD number and the program terminals P13 through P16 of a thirteenth through sixteenth digits the thousandth place of a BCD number.

An output terminal 210 of an AND gate 96 is connected to clock terminals CK of D flip-flops 212-1 through 212-4, 214-1 through 214-4, 216-1 through 216-4 and 218-1 through 218-4 which form shift registers 212, 214, 216 and 218. Output terminals Q of the D flip-flops 212-1, 214-1, 216-1 and 218-1 are connected to input terminals D of the first through fourth digits of latch circuit 206, i.e., of the D flip-flops 206-1 through 206-4, and to input terminals A1 through A4 of the first through fourth digits of an adder-subtracter 220, respectively. The first through fourth digits of the adder-subtracter 220 correspond to binary numbers 1, 2, 4 and 8, respectively, and shift registers 212, 214, 216 and 218 are weighted 1, 2, 4 and 8, respectively. Though not shown, output terminals Q of the D flip-flops 212-2 through 218-2, 212-3 through 218-3 and 212-4 through 218-4 are similarly and successively connected to input terminals D of the fifth through sixteenth digits of the latch circuit 206. Output terminals S1 through S4 of the adder-subtracter 220 are connected to input terminals D of the shift registers 212, 214, 216 and 218 and to a display portion 222.

The output terminal 210 of the AND gate 96 is also connected to clock terminals CK of D flip-flops 224-1 through 224-4, 226-1 through 226-4, 228-1 through 228-4 and 230-1 through 230-4 which form shift registers 224, 226, 228 and 230. Shift registers 224, 226, 228 and 230 are also weighted 1, 2, 4 and 8, respectively. Output terminals of the shift registers 224, 226, 228 and 230, i.e., output terminals Q of the D flip-flops 224-1, 226-1, 228-1 and 230-1 are connected to input terminals B1 through B4 of the first through fourth digits of the adder-subtracter 220, respectively. Output terminals Q of the D flip-flops 224-1, 226-1, 228-1 and 230-1 are also connected to one input terminals of AND gates 232, 234, 236 and 238, respectively. Control terminals 240, 242, 244 and 246 are connected direct to the other input terminals of the AND gates 232, 234, 236 and 238, and via inverters 248, 250, 252 and 254 to one input terminals of AND gates 256, 258, 260 and 262. Data terminals 264, 266, 268 and 270 are connected to the other input terminals of the AND gates 256, 258, 260 and 262. Output terminals of the AND gates 232 and 256 are connected to input terminals of an OR gate 272, output terminals of the AND gates 234 and 258 to input terminals of an OR gate 274, output terminals of the AND gates 236 and 260 to input terminals of an OR gate 276 and output terminals of the AND gates 238 and 262 to input terminals of an OR gate 278. Output terminals of the OR gates 272, 274, 276 and 278 are connected to input terminals of the shift registers 224, 226, 228 and 230, i.e., of the D flip-flops 224-4, 226-4, 228-4 and 230-4, respectively.

The operation of this second embodiment will be now described. Though not shown, it is also regarded in this second embodiment that reset terminals of the shift registers 212, 214, 216 and 218 are connected to a power source terminal $V_{DD}$ and that data in the shift registers 212, 214, 216 and 218 are reset to zero by power supply. Or it is regarded that initial data in the shift registers 212, 214, 216 and 218 are supplied from a ROM. It is regarded that initial data in the shift registers 224, 226, 228 and 230 are zero. After power supply, control terminals 240, 242, 244 and 246 are firstly set to L level and data terminals 264, 266, 268 and 270 are set to a level corresponding to an add-subtract value of the adder-subtracter 220, i.e., the changed portion of the frequency dividing ratio when it is changed. Providing that this changed portion of the frequency dividing ratio correspond to 9, the shift registers 224, 226, 228 and 230 are weighted 1, 2, 4 and 8, respectively, so that the data terminals 264 and 270 are set to H level and the data terminals 266 and 268 L level, thus causing the output terminals of the OR gates 272 and 278 to become H level and the output terminals of the OR gates 274 and 276 L level.

When a clock pulse signal shown in FIG. 5A is supplied to the clock terminal 10 in FIG. 4A, pulse signals shown in FIGS. 5B and 5C are produced from the inverters 22 and 18, respectively. Therefore, the output signal of the NOR gate 24 becomes as shown in FIG. 5D. Since the output signal (FIG. 5B) of the inverter 22 is supplied to the clock terminals CK of the D flip-flops 200 and 202, pulse signals shown in FIGS. 5E and 5F are produced from the output terminal Q of the D flip-flop 200 and the output terminal $\overline{Q}$ of the D flip-flop 202, respectively. The output signal of the AND gate 204 thus becomes as shown in FIG. 5G and has one pulse every time when four output pulses are produced from the NOR gate 24.

When the up-counting switch 102 is closed, a connection point between the switch 102 and resistor 106 becomes of L level as shown in FIG. 5H, thus causing the output terminals of the NAND gates 110 and 112 to become of H level as shown in FIGS. 5I and 5J, respectively. The output signal (FIG. 5I) of the NAND gate 110 is supplied to the input terminal D of the D flip-flop 100, and therefore signals applied from the output terminals Q and $\overline{Q}$ of the D flip-flop 100 come to have pulses shown in FIGS. 5K and 5L, respectively. The output signal (FIG. 5D) of the NOR gate 24 and the Q output signal (FIG. 5K) of the D flip-flop 100 are supplied to the AND gate 96, causing the output signal of the AND gate 96 to become a pulse signal as shown in FIG. 5M. When one pulse is supplied from the AND gate 96 to the shift registers 212, 214, 216, 218, 224, 226, 228 and 230, signals of H, L, L and H levels are supplied from the NOR gates 272, 274, 276 and 278 to the D flip-flops 224-4, 226-4, 228-4 and 230-4, respectively. Before a next pulse is supplied to the shift registers, the control terminals 240, 242, 244 and 246 are made H level and the AND gates 256, 258, 260 and 262 non-conductive. This causes the output signals of the D flip-flops 224-1, 226-1, 228-1 and 230-1 to be supplied to the input terminals D of the D flip-flops 224-4, 226-4, 228-4 and 230-4, respectively, in the following process. And when three pulses are supplied from the AND gate 96 to the shift registers 224, 226, 228 and 230, data of H level are set only in the D flip-flops 224-1 and 230-1 of the shift registers 224, 226, 228 and 230, and data of L level in the other D flip-flops. During this time period, signals of L level are supplied from the output terminals Q of the D flip-flops 224-1, 226-1, 228-1 and 230-1 to the input terminals B1, B2, B3 and B4 of the adder-subtracter 220, respectively. FIGS. 6B, 6C, 6D and 6E respectively show levels of the input terminals B1, B2, B3 and B4 of the adder-subtracter 220, in which the signal shown in FIG. 6A is same as the one shown in FIG. 5M and these signals are illustrated with the same time axis. The output terminal of the NAND gate 112 is of H level as shown in FIG. 5J so that the control terminal of the adder-subtracter 220 become H level and the adder-subtracter 220 is set to an addition mode.

It is now regarded that the initial value of the shift registers 212, 214, 216 and 218 is 1854 (decimal number) and that only D flip-flops 216-1, 212-2, 216-2, 218-3 and 212-4 are set to H level and the others L level as those of the D flip-flops in the shift registers 212, 214, 216 and 218 which have a subscript 1 correspond to the unit place of decimal number, those having a subscript 2 to the tenth place thereof, those having a subscript 3 to the hundredth place thereof and those having a subscript 4 to the thousandth place thereof. Data in the shift registers 212, 214, 216 and 218 are successively supplied to the input terminals A1, A2, A3 and A4 of the adder-subtracter 220 responsive to the output pulse (FIG. 5M) of the AND gate 96. FIGS. 6F through 6I show levels of the input terminals A1 through A4 of the adder-subtracter 220, respectively. FIGS. 6J through 6M show levels of the output terminals S1 through S4 of the adder-subtracter 220, respectively. Since levels of the input terminals B1 through B4 of the adder-subtracter 220 are of L level until the fourth pulse of the output pulse (FIG. 5M) of the AND gate 96 is applied, levels of the output terminals S1 through S4 of the adder-subtracter 220 are same as those of the input terminals A1 through A4 thereof. Output signals of the adder-subtracter 220 are supplied to the shift registers 212, 214, 216 and 218, and therefore, data in the shift registers 212, 214, 216 and 218 are not changed during this time period. Namely, the time period during which the up-counting switch 102 is closed and four pulses are applied from the AND gate 96 is intended to set the add-subtract value of the adder-subtracter 220 to the shift registers 224, 226, 228 and 230. Same thing can be said even when the down-counting switch 104 is closed instead of the up-counting switch 102.

When the switch 102 still continues to be closed, the Q output terminal of the D flip-flop 100 is held of H level as shown in FIG. 5K. Therefore, the pulse signal shown in FIG. 5M is applied from the AND gate 96, so that data corresonding to respective places of BCD number 1,854 and shown in FIGS. 6F through 6I are supplied from the shift registers 212, 214, 216 and 218 to the input terminals A1 through A4 of the adder-subtracter 220, respectively, and data corresponding to respective places of BCD number 9 and shown in FIGS. 6B through 6E are supplied from the shift registers 224, 226, 228 and 230 to the input terminals B1 through B4 of the adder-subtracter 220, respectively. The output terminals S1 through S4 of the adder-subtracter 220 come to have such levels as shown in FIGS. 6J through 6M and a BCD number 1863 is stored in the shift registers 212, 214, 216 and 218.

When the up-counting switch 102 is opened, the output terminal of the NAND gate 110 becomes of L level as shown in FIG. 5I and then Q and $\overline{Q}$ output terminals of the D flip-flop 100 become of L and H levels as shown in FIGS. 5K and 5L responsive to the output pulse (FIG. 5G) of the NAND gate 204. The Q output signal of L level causes the AND gate 96 to be made non-conductive and the output terminal of the AND gate 96 becomes of L level as shown in FIG. 5M (or FIG. 6A). The shifting operation of the shift registers 212, 214, 216, 218, 224, 226, 228 and 230 is thus finished and levels of the input terminals B1 through B4 and A1 through A4 of the adder-subtracter 220 become invariable as shown in FIGS. 6B through 6I, respectively. Therefore, data in the shift registers 212, 214, 216 and 218 are kept 1863. Though data in the shift registers 212, 214, 216 and 218 are latched by the latch circuit 206, the $\overline{Q}$ output signal (FIG. 5L) of the D flip-flop 100 which is of H level causes these data to be released from latched condition and BCD number 1863 is supplied to the program terminals P1 through P16 of the programmable counter 208, thus allowing the frequency dividing ratio of the programmable counter 208 to be set.

When the down-counting switch 104 is then closed, the connection point between the switch 104 and resistor 108 becomes of L level as shown in FIG. 6N and the output terminals of the NAND gates 110 and 112 become of H and L levels as shown in FIGS. 5I and 5J, respectively. The adder-subtracter 220 is set to a subtraction mode. Similarly in an addition mode, the pulse signal as shown in FIG. 5M (or FIG. 6A) is applied from the AND gate 96 and the shift registers 212, 214, 216, 218, 224, 226, 228 and 230 perform their shifting operations. The adder-subtracter 220 subtracts the B1 through B4 input signals as shown in FIGS. 6B through 6E from the A1 through A4 input signals as shown in FIGS. 6F through 6I and supplies signals as shown in FIGS. 6J through 6M through the output terminals S1 through S4 thereof. Namely, the frequency dividing ratio is decreased by every 9.

The second embodiment also allows the frequency dividing ratio to be easily changed by means of the adder-subtracter and the frequency dividing ratio expressed by BCD number to be advantageously displayed by the display portion 222. For the purpose of changing the changed portion of the frequency dividing ratio, the control terminals 240, 242, 244 and 246 may be made to L level to supply appropriate data to the data terminals 264, 266, 268 and 270. Since the latch circuit 206 is arranged to keep the frequency dividing ratio invariable during the add-subtract process of changing the frequency dividing ratio, no undesired noise is generated when the synthesizer-receiver of PLL type is tuned.

It should be understood that the present invention is not limited to embodiments described above. RAM or ROM may be employed as a circuit for generating the add-subtract value. When it is arranged in this case that the add-subtract value is supplied in four-bit and parallel, the construction of system will be made simple.

What we claim is:

1. A frequency dividing ratio setting device for a programmable counter comprising:
   operation indicating means for generating an operation indicating signal to indicate an add or subtract operation;
   data generating means for generating a numerical data signal to change a frequency dividing ratio;
   adder-subtracter means which has a first input terminal connected to said data generating means to receive the numerical data signal, a second input terminal, and a control terminal connected to said operation indicating means to receive the operation indicating signal and which adder-subtracter means additively combines two input signals, in accordance with the indicating signal, to produce a frequency dividing ratio;
   a programmable counter having a frequency dividing ratio setting terminal; and
   register means which has an input terminal connected to an output terminal of said adder-subtracter means, an output terminal connected to the second input terminal of said adder-subtracter means and also to the frequency dividing ratio setting terminal of the programmable counter, and a clock terminal connected to said operation indicating means, said register means storing the frequency dividing ratio produced from said adder-subtracter means and outputting the stored ratio to the second input terminal of said adder-subtracter means and to the frequency dividing ratio setting terminal of the programmable counter in response to generation of the operation indicating signal.

2. A device according to claim 1, in which said programmable counter is an N-bit binary counter having frequency dividing ratio setting terminals of respective bits, said adder-subtracter means produces an N-bit frequency dividing ratio bit by bit and said register means has an N-bit shift-register in which a most-significant-bit input terminal is connected to the output terminal of said adder-subtracter means and output terminals of respective bits are connected to frequency dividing ratio setting terminals of respective bits of the programmable counter and further including a clock generator for supplying a clock signal having N pulses to clock terminals of all bits of the shift-register responsive to the operation indicating signal.

3. A device according to claim 2, in which said data generating means supplies the numerical data signal of N-bit to the first input terminal of said adder-subtracter means bit by bit when the clock generator produces a clock signal and the output terminal of the least-significant-bit of said shift-register is connected to the second input terminal of said adder-subtracter means.

4. A device according to claim 1, in which said operation indicating means has manually operated switches and produces an operation indicating signal in accordance with the closed or open state of the switches.

5. A device according to claim 1, which further comprises display means connected to the output terminal of said adder-subtracter means for displaying the frequency dividing ratio.

6. A device according to claim 1, in which said programmable counter is an M-digit binary-coded-decimal counter having frequency-dividing-ratio setting terminals corresponding to the respective bits of respective digits thereof, said adder-subtracter means produces an M-digit BCD frequency dividing ratio digit by digit and said register means has M shift-registers, each of which is a 4-bit shift-register in which the most-significant-bit input terminals of respective digits are connected to output terminals of respective digits of said adder-subtracter means and output terminals corresponding to respective bits of respective digits are respectively connected to the frequency dividing ratio setting terminals corresponding to the respective bits of respective digits of the programmable counter and further including a clock generator (FIG. 4A) for applying a clock signal having four pulses to clock terminals of all bits of all the shift-registers in accordance with the operation indicating signal.

7. A device according to claim 6, in which said data generating means has M-digit shift-registers, each of which is a 4-bit shift-register, in which 4-bit output terminals of respective digits are connected to first input terminals of respective digits of the adder-subtracter means and clock terminals of all bits of all digits are supplied with the clock signal produced from said clock generator and the output terminals of the least significant bit of respective digits of said shift registers are respectively connected to the second input terminals of said adder-subtracter means.

8. A device according to claim 6, in which said operation indicating means has manually operated switches and produces an operation indicating signal in accordance with the closed or open state of the switches.

9. A device according to claim 6, which further comprises display means connected to the output terminal of said adder-subtracter means for displaying the frequency dividing ratio.

* * * * *